United States Patent
Satou et al.

(10) Patent No.: US 7,031,359 B2
(45) Date of Patent: Apr. 18, 2006

(54) HIGH-FREQUENCY SUPERPOSING MODULE FOR DRIVING LASER DIODE

(75) Inventors: Yoshirou Satou, Shiga-ken (JP); Kazuhiro Iida, Shiga-ken (JP); Masamichi Tamura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 278 days.

(21) Appl. No.: 10/735,764

(22) Filed: Dec. 16, 2003

(65) Prior Publication Data

US 2004/0161003 A1 Aug. 19, 2004

(30) Foreign Application Priority Data

Feb. 18, 2003 (JP) .............................. 2003-039580

(51) Int. Cl.
*H01S 3/00* (2006.01)

(52) U.S. Cl. ..................... 372/38.02; 369/116
(58) Field of Classification Search ............... None
See application file for complete search history.

(56) References Cited

U.S. PATENT DOCUMENTS 6,385,219 B1 * 5/2002 Sonoda ................... 372/28
6,914,872 B1 * 7/2005 Tanaka ................... 369/116

FOREIGN PATENT DOCUMENTS

| JP | 10-256630 | 9/1998 |
| JP | 2002-251763 | 9/2002 |
| WO | WO98/01856 | 1/1998 |

* cited by examiner

*Primary Examiner*—James Vannucci
(74) *Attorney, Agent, or Firm*—Keating & Bennett, LLP

(57) ABSTRACT

A high-frequency superposing module for driving a laser diode includes an oscillating circuit and an impedance matching circuit. The impedance matching circuit includes a capacitor connected in series between the emitter of a transistor and the terminal through which a laser-diode drive signal is output; and a capacitor connected in parallel between the drive-signal output terminal and the ground. The oscillating circuit includes an inductor serving as a choke coil connected between the drive-signal output terminal and the collector of the transistor, thus allowing the drive-signal output terminal to serve as a power input terminal for the oscillating circuit.

16 Claims, 8 Drawing Sheets

HIGH-FREQUENCY SUPERPOSING MODULE FOR DRIVING LASER DIODE

BACKGROUND OF THE INVENTION

1. Field of the Invention

The present invention relates to a high-frequency superposing module for driving a laser diode by superposing a high-frequency current on a DC current.

2. Description of the Related Art

In a conventional laser-diode drive circuit, a laser diode is driven in a multiple mode where a high-frequency current is superposed on a driving DC current, thereby preventing the generation of mode-hopping noise resulting from an increase in the temperature of the laser diode. For superposing a high-frequency current on a DC current, an oscillating circuit that generates a high-frequency signal is used as described in, for example, Japanese Unexamined Patent Application Publication Nos. 2002-251763 and 10-256630 and Domestic Re-publication of PCT Publication No. 98/01856.

FIG. 7 is a circuit diagram of a conventional laser-diode drive circuit disclosed in Japanese Unexamined Patent Application Publication No. 10-256630. In this circuit, a DC current is supplied via an input terminal LDD to a laser diode LD. A low-pass filter composed of capacitors C7 and C8 and inductors L4 and L5 is disposed between the terminal LDD and the laser diode LD. The rest of the circuit shown in FIG. 7 is an oscillating circuit section for superposing a high-frequency current for driving the laser diode LD. The oscillating circuit section is supplied with power via a power input terminal Vcc. Resistors R1 to R4 apply a predetermined DC bias to a transistor Q1. This oscillating circuit section is a Colpitts oscillator and its oscillation frequency is determined by the values of capacitors C1, C2, C4, C5, and C9 and inductors L1 and L2. Furthermore, the capacitors C4 and C5 act as an impedance matching circuit section between the laser diode LD and the oscillating circuit section.

FIG. 8 shows the main part of a circuit described in an embodiment of Japanese Unexamined Patent Application Publication No. 2002-251763. In FIG. 8, resistors R1 to R3 apply a predetermined DC bias to a transistor Q1. This oscillating circuit section is also a Colpitts oscillator whose oscillation frequency is determined by the values of capacitors C1, C2, and C3 and inductors L1 and L2. An inductor L3 represents a load impedance and draws an oscillation output for a laser diode LD from the collector of the transistor Q1.

Referring back to FIG. 7, a typical circuit requires two power supplies: one for supplying a DC current to the laser diode LD and the other for the oscillating circuit section which generates a high-frequency current to be superposed on the DC current. The less the number of power supplies, the more preferable the circuit is. Likewise, the less the number of external terminals, the more preferable the circuit is for compact design of a module, particularly if the oscillating circuit section is implemented in a different module from that for the laser diode, that is, if the oscillating circuit section is implemented as a separate module for use in combination with the laser diode.

The object described above is achieved in the circuit shown in FIG. 8, where the high-frequency signal output terminal of the oscillating circuit section also functions as a power input terminal.

Unfortunately, the circuit shown in FIG. 8 cannot have an impedance matching circuit section unlike the circuit in FIG. 7, because the circuit in FIG. 8 requires the power input terminal, which also functions as the output terminal of the oscillating circuit section, to be connected directly to the laser diode to pass a DC current, thus preventing a capacitor from being disposed in series in the output portion of the oscillating circuit section.

SUMMARY OF THE INVENTION

In order to overcome the problems described above, preferred embodiments of the present invention provide a high-frequency superposing module for driving a laser diode having a high-frequency signal output terminal which also functions as a power input terminal and an impedance matching circuit including a series capacitor and a parallel capacitor.

According to a preferred embodiment of the present invention, a high-frequency superposing module drives a laser diode by supplying the laser diode with a drive current composed of a DC current and a high-frequency current superposed on the DC current. The high-frequency superposing module includes an oscillating circuit and an impedance matching circuit. The oscillating circuit includes an oscillating active element and a high-frequency blocking inductor. The impedance matching circuit includes a capacitor connected in series between the output terminal of the oscillating active element and a terminal through which a signal for driving the laser diode is output; and another capacitor connected in parallel between the drive-signal output terminal and the ground. The high-frequency blocking inductor is connected between the drive-signal output terminal and the source terminal of the oscillating active element, thus allowing the drive-signal output terminal to function as a power input terminal for the oscillating circuit.

With this unique structure, the oscillating circuit requires only one power supply and fewer terminals, thus contributing to the very compact design of the high-frequency superposing module. Thus, a user can easily implement the compact module in a circuit. Furthermore, the impedance matching circuit disposed between the oscillating circuit and the laser diode reduces current consumption and suppresses radiation.

In the high-frequency superposing module for driving a laser diode, a portion of the oscillating circuit may be composed of a conductive pattern in a ceramic multilayer substrate, and a component constituting at least a portion of the oscillating circuit and impedance matching circuit is mounted on the ceramic multilayer substrate.

This structure facilitates the adjustment of the oscillating circuit and/or the impedance matching circuit. For example, when the high-frequency superposing module is to be used in combination with a laser diode having different characteristics, the ceramic multilayer substrate can be used as is and only a relevant component of the oscillating circuit and/or the impedance matching circuit mounted on the ceramic multilayer substrate may be changed, thus exhibiting flexible application of the oscillating circuit to laser diodes having various characteristics.

Other features, elements, characteristics and advantages of the present invention will become more apparent form the following detailed description of preferred embodiments with reference to the attached drawings.

DETAILED DESCRIPTION OF PREFERRED EMBODIMENTS

Figure 1:
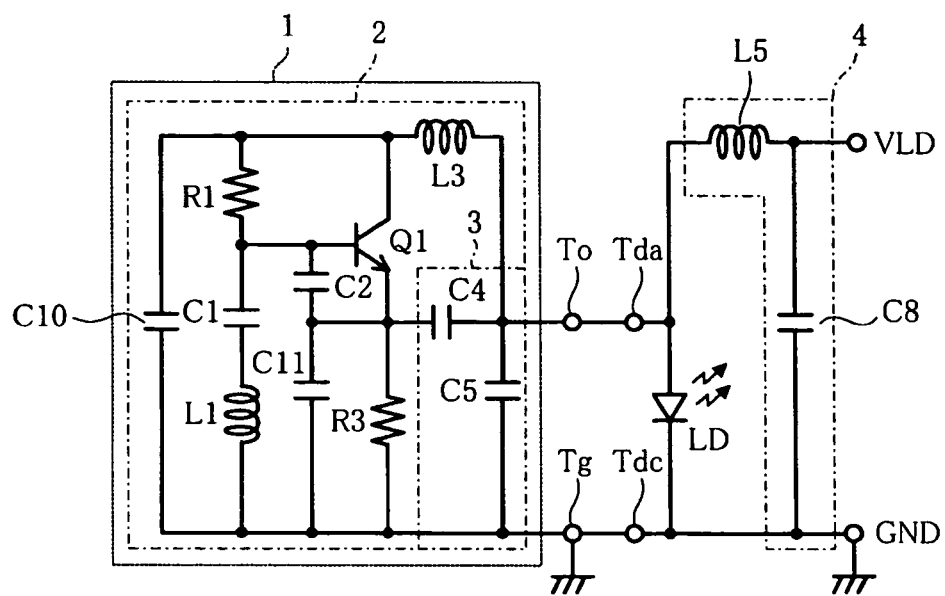
FIG. 1 is a circuit diagram of a high-frequency superposing module for driving a laser diode according to a first preferred embodiment of the present invention.

FIG. 1 is a circuit diagram of a high-frequency superposing module 1 for driving a laser diode LD according to a first preferred embodiment of the present invention. In FIG. 1, a noise suppression filter circuit 4 including a capacitor C8 and an inductor L5 is disposed between a power terminal VLD and the laser diode LD. The laser diode LD has an anode terminal Tda and a cathode terminal Tdc connected to a ground terminal GND. The high-frequency superposing module 1 has a terminal To for outputting a drive signal and a ground terminal Tg. To operate the high-frequency superposing module 1, the terminals To and Tg are connected to the terminals Tda and Tdc, respectively. If the high-frequency superposing module 1 is not connected, the laser diode LD is driven only by a DC current supplied from the power terminal VLD.

The high-frequency superposing module 1 receives a power supply therefor via the drive-signal output terminal To and also outputs a high-frequency signal to the laser diode LD via the same drive-signal output terminal To. A resistor R1 connected between the base and collector of a transistor Q1 and a resistor R3 connected between the emitter of the transistor Q1 and the ground together constitute a DC bias circuit section for the transistor Q1. Between the base of the transistor Q1 and the ground are connected a series circuit section including a capacitor C1 and an inductor L1 and a series circuit section of capacitors C2 and C11. The node between the capacitors C2 and C11 is connected to the emitter of the transistor Q1 to apply the voltage across the capacitor C2 from the base to the emitter of the transistor Q1. The collector of the transistor Q1 is RF-grounded through a capacitor C10. More specifically, the collector of the transistor Q1 is connected to the ground with substantially zero impedance for high-frequency signals. A Colpitts oscillating circuit is structured as described above.

A capacitor C4 is connected in series between the emitter of the transistor Q1 and the drive-signal output terminal To, and a capacitor C5 is connected in parallel between the drive-signal output terminal To and the ground. These capacitors C4 and C5 constitute an impedance matching circuit 3 between the high-frequency superposing module 1 and the laser diode LD. The oscillation frequency of the Colpitts oscillating circuit is determined by the values of the capacitors C1, C2, C4, C5, and C11 and inductor L1.

An inductor L3 is connected between the drive-signal output terminal To and the collector of the transistor Q1. This inductor L3 works as a choke coil and it allows a power voltage to be supplied from the drive-signal output terminal To to an oscillating circuit 2, but prevents an oscillation signal from returning to the collector of the transistor Q1.

An oscillation signal is drawn across the resistor R3 disposed between the emitter of the transistor Q1 and the ground, i.e., from the emitter of the transistor Q1.

In this manner, the drive voltage for the laser diode LD is also supplied to the oscillating circuit 2 and an oscillation signal is sent to the laser diode LD.

Furthermore, the impedance matching circuit 3 including the series capacitor C4 and the parallel capacitor C5 is disposed between the emitter of the transistor Q1 and the drive-signal output terminal To for impedance matching between the oscillating circuit 2 and the laser diode LD. This impedance matching reduces current consumption and radiation.

Figure 2:
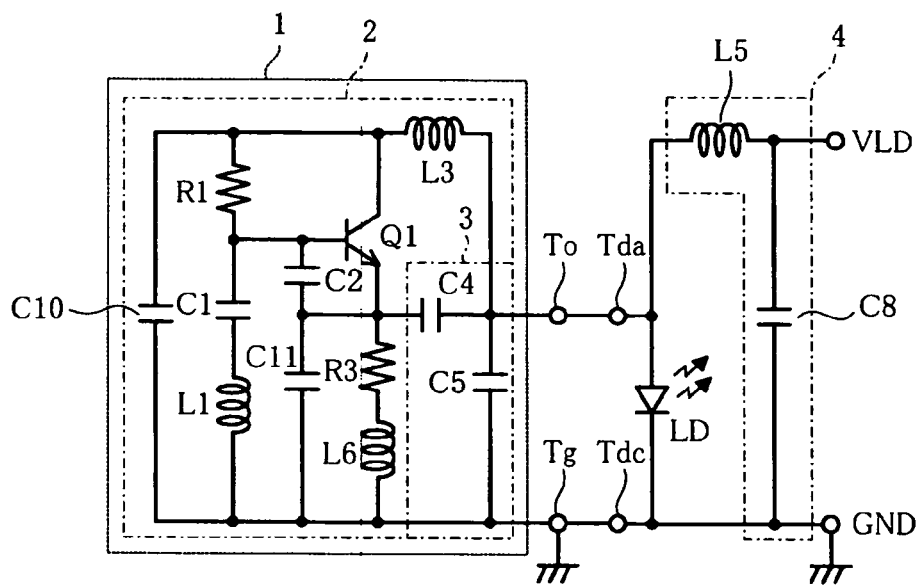
FIG. 2 is a circuit diagram of a high-frequency superposing module for driving a laser diode according to a second preferred embodiment of the present invention.

FIG. 2 is a circuit diagram of a high-frequency superposing module 1 for driving a laser diode LD according to a second preferred embodiment of the present invention. In the second preferred embodiment, a series circuit section including a resistor R3 and an inductor L6 is disposed between the emitter of a transistor Q1 and the ground. This inductor L6 increases the impedance for a high-frequency signal to enhance an oscillation output.

Figure 3:
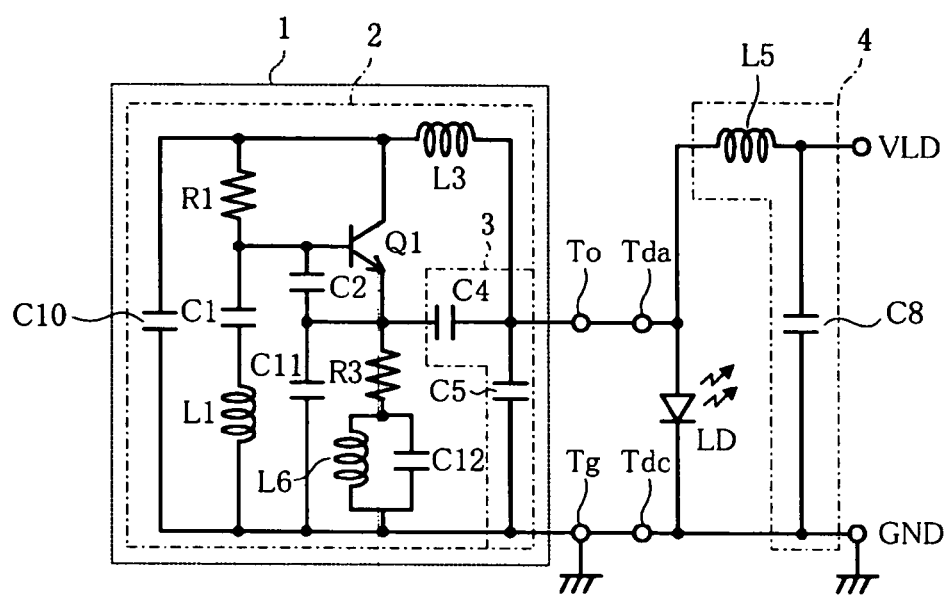
FIG. 3 is a circuit diagram of a high-frequency superposing module for driving a laser diode according to a third preferred embodiment of the present invention.

FIG. 3 is a circuit diagram of a high-frequency superposing module 1 for driving a laser diode LD according to a third preferred embodiment of the present invention. In the third preferred embodiment, a series circuit section including a parallel circuit section (an inductor L6 and a capacitor C12) and a resistor R3 is disposed between the emitter of a transistor Q1 and the ground. This structure increases the impedance for the parallel resonating frequency with the inductor L6 and the capacitor C12. By matching this parallel resonating frequency to the oscillation frequency, an oscillation output can be increased.

Figure 4:
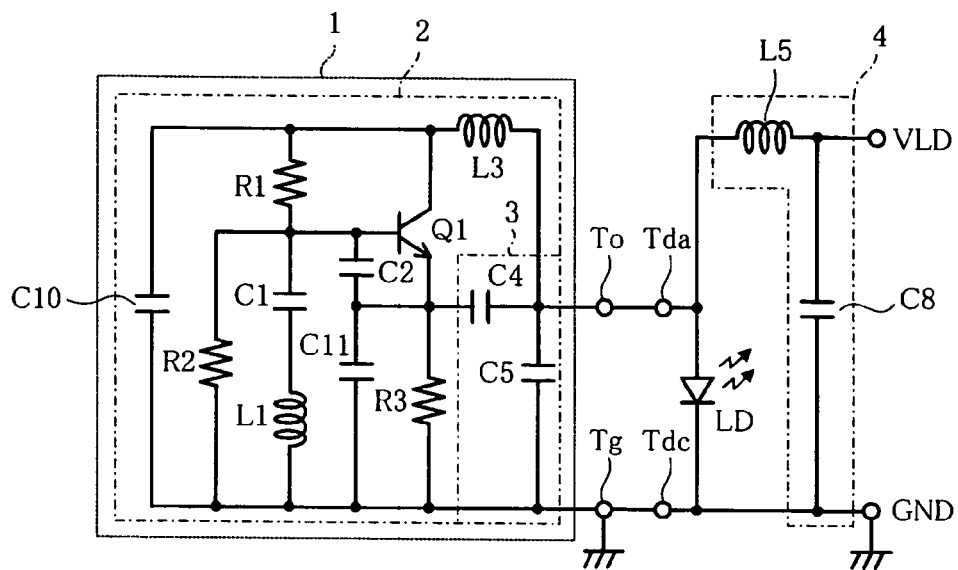
FIG. 4 is a circuit diagram of a high-frequency superposing module for driving a laser diode according to a fourth preferred embodiment of the present invention.

FIG. 4 is a circuit diagram of a high-frequency superposing module 1 for driving a laser diode LD according to a fourth preferred embodiment of the present invention. In the fourth preferred embodiment, a resistor R2 is disposed between the base of a transistor Q1 and the ground. This structure reduces the fluctuation of the base bias voltage with respect to the fluctuation of the supply voltage, thereby stabilizing an oscillation output.

Figure 5:
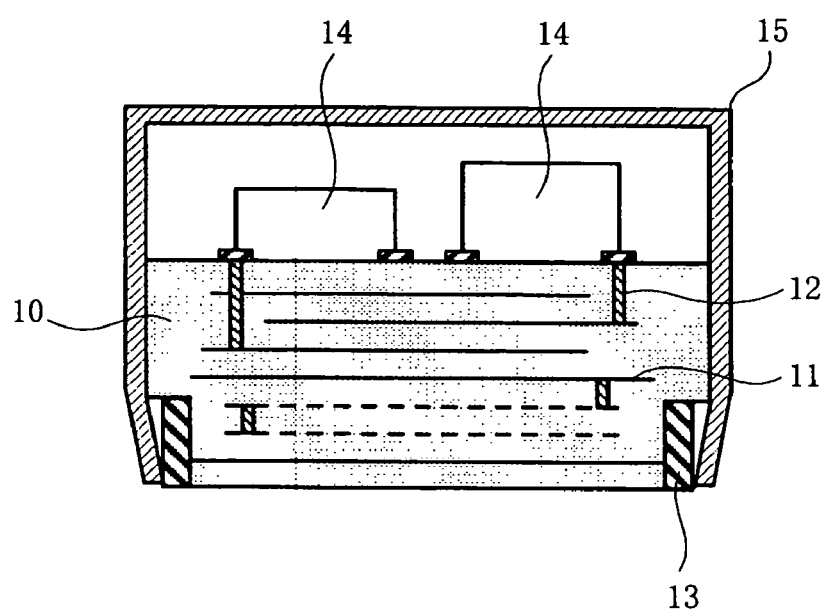
FIG. 5 is a sectional view of a high-frequency superposing module.
Figure 6:
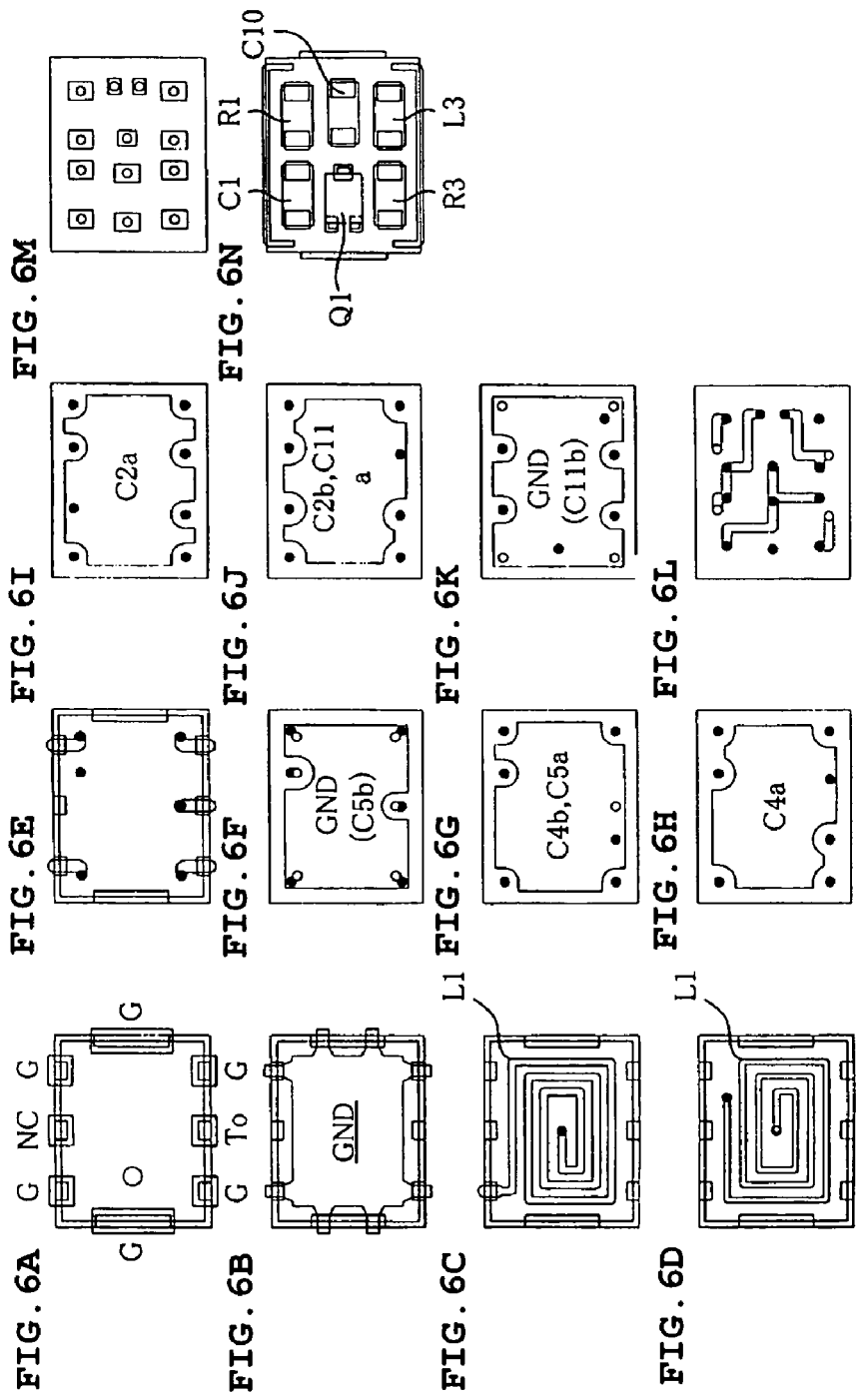
FIGS. 6A to 6N are plan views of the layers of the ceramic multilayer substrate shown in FIG. 5.
Figure 7:
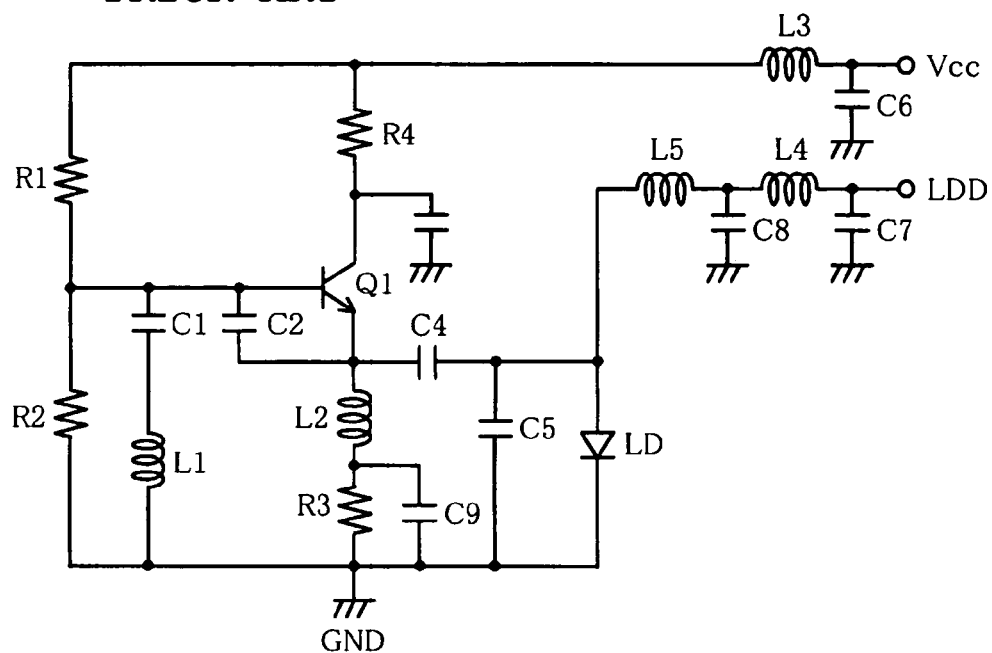
FIG. 7 is a circuit diagram of a conventional laser-diode drive circuit.
Figure 8:
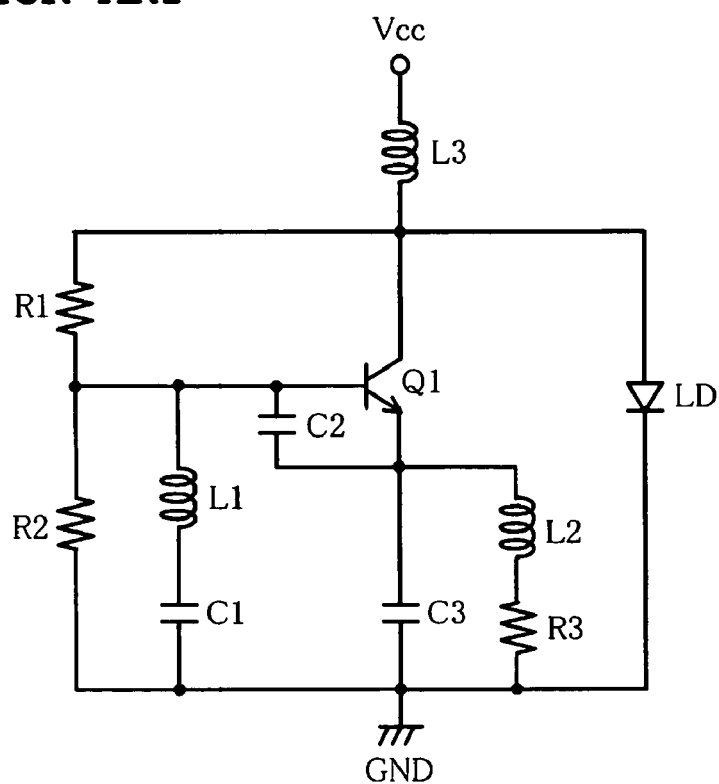
FIG. 8 is a circuit diagram of another conventional laser-diode drive circuit.

FIGS. 5 and 6A to 6N illustrate the structure of the high-frequency superposing module 1 for driving the laser diode LD shown in FIG. 1. FIG. 5 is a sectional view of the high-frequency superposing module 1 in FIG. 1. As shown, the high-frequency superposing module 1 includes a ceramic multilayer substrate 10 formed of a plurality of laminated ceramic layers having various conductive patterns 11. The ceramic multilayer substrate 10 has therein via holes 12 in addition to the conductive patterns 11. The high-frequency superposing module 1 also includes terminal electrodes 13 in its lower portion. The ceramic multilayer substrate 10 has surface mount components 14 on its upper surface. The oscillating circuit 2 (shown in FIG. 1) is shielded with a metal case 15 covering the sides and the upper surface of the ceramic multilayer substrate 10.

FIGS. 6A to 6N are plan views of the layers of the ceramic multilayer substrate 10 shown in FIG. 5. FIGS. 6A to 6M show layers as viewed from the bottom. FIG. 6A shows the bottommost layer and FIG. 6M shows the topmost layer. The layer in FIG. 6M shows patterns for chip components on the mount surface. FIG. 6N is a top view of the mount surface provided with the chip components.

FIG. 6A shows ground terminals G and a free terminal NC. The ground electrode GND occupies most of the entire surface of the layer in FIG. 6B. A line defining the inductor L1 is formed on the layers in FIGS. 6C and 6D. Electrodes defining the capacitors C4, C5, C2, and C11 and the ground electrode are disposed on the layers in FIGS. 6F to 6K. As shown in FIG. 6N, chip components such as the capacitors C1 and C10, resistors R1 and R3, inductor L3, and transistor Q1 are mounted on the upper surface of the ceramic multilayer substrate 10. The symbols in FIGS. 6A to 6N correspond to those of the circuit elements in FIG. 1. In FIGS. 6A to 6N, two capacitor symbols different from each other only in the suffix a or b, such as C4a and C4b, represent one electrode and the other electrode of the same capacitor.

As described above, capacitors and inductors are disposed in the ceramic multilayer substrate and other components including transistors are mounted on top of the ceramic multilayer substrate, thereby contributing to compact design of the high-frequency superposing module for driving the laser diode.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A high-frequency superposing module for driving a laser diode by supplying the laser diode with a drive current including a DC current and a high-frequency current superposed on the DC current, the module comprising:
    an oscillating circuit including:
        an oscillating active element; and
        a high-frequency blocking inductor connected between a drive-signal output terminal through which a signal for driving the laser diode is output and a source terminal of the oscillating active element, the drive-signal output terminal functioning as a power input terminal for the oscillating circuit; and
    an impedance matching circuit including:
        a capacitor connected in series between an output terminal of the oscillating active element and the drive-signal output terminal; and
        a capacitor connected in parallel between the drive-signal output terminal and a ground.

2. The high-frequency superposing module for driving a laser diode according to claim 1, wherein a portion of the oscillating circuit includes a conductive pattern disposed in a ceramic multilayer substrate, and a component constituting at least a portion of the oscillating circuit and the impedance matching circuit is mounted on the ceramic multilayer substrate.

3. The high-frequency superposing module for driving a laser diode according to claim 1, further comprising a noise suppression filter circuit disposed between the power input terminal and the laser diode.

4. The high-frequency superposing module for driving a laser diode according to claim 3, wherein the noise suppression filter includes a capacitor and an inductor.

5. The high-frequency superposing module for driving a laser diode according to claim 1, wherein the impedance matching circuit including the series capacitor and the parallel capacitor is arranged for impedance matching between the oscillating circuit and the laser diode.

6. The high-frequency superposing module for driving a laser diode according to claim 1, wherein the oscillating circuit includes a transistor, a first resistor connected between a base and a collector of the transistor and a second resistor connected between an emitter of the transistor and the ground.

7. The high-frequency superposing module for driving a laser diode according to claim 6, wherein a first series circuit including a capacitor and an inductor and a second series circuit including at least two capacitors are connected between the base of the transistor and the ground.

8. The high-frequency superposing module for driving a laser diode according to claim 1, wherein the oscillating circuit is a Colpitts oscillating circuit.

9. The high-frequency superposing module for driving a laser diode according to claim 6, wherein the series capacitor is connected in series between the emitter of the transistor and the drive-signal output terminal.

10. The high-frequency superposing module for driving a laser diode according to claim 6, wherein the parallel capacitor is connected in parallel between the drive-signal output terminal and the ground.

11. The high-frequency superposing module for driving a laser diode according to claim 6, wherein a series circuit including a resistor and an inductor is disposed between the emitter of the transistor and the ground.

12. The high-frequency superposing module for driving a laser diode according to claim 6, wherein a series circuit including a parallel circuit having an inductor and a capacitor, and a resistor, are disposed between the emitter of the transistor and the ground.

13. The high-frequency superposing module for driving a laser diode according to claim 6, wherein a resistor is disposed between the base of the transistor and the ground.

14. The high-frequency superposing module for driving a laser diode according to claim 2, wherein the ceramic multilayer substrate includes a plurality of laminated ceramic layers having conductive patterns disposed thereon.

15. The high-frequency superposing module for driving a laser diode according to claim 2, wherein the ceramic multilayer substrate includes a plurality of via holes formed therein.

16. The high-frequency superposing module for driving a laser diode according to claim 2, further comprising a metal case arranged to cover sides of the ceramic multilayer substrate.

* * * * *